(12) United States Patent
Cheng et al.

(10) Patent No.: US 9,653,602 B1
(45) Date of Patent: May 16, 2017

(54) TENSILE AND COMPRESSIVE FINS FOR VERTICAL FIELD EFFECT TRANSISTORS

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/075,290

(22) Filed: Mar. 21, 2016

(51) Int. Cl.

| | | |
|---|---|---|
| H01L 21/8232 | (2006.01) | |
| H01L 29/78 | (2006.01) | |
| H01L 21/8238 | (2006.01) | |
| H01L 27/092 | (2006.01) | |
| H01L 29/49 | (2006.01) | |
| H01L 29/66 | (2006.01) | |
| H01L 27/112 | (2006.01) | |

(52) U.S. Cl.
CPC .. *H01L 29/7845* (2013.01); *H01L 21/823842* (2013.01); *H01L 21/823885* (2013.01); *H01L 27/092* (2013.01); *H01L 29/4966* (2013.01); *H01L 29/66545* (2013.01); *H01L 29/66666* (2013.01); *H01L 29/7827* (2013.01); *H01L 27/11273* (2013.01)

(58) Field of Classification Search
CPC .......... H01L 27/11273; H01L 29/7827; H01L 21/823487

USPC .......................................... 257/288; 438/270
See application file for complete search history.

(56) References Cited

U.S. PATENT DOCUMENTS

| | | |
|---|---|---|
| 6,977,194 B2 | 12/2005 | Belyansky et al. |
| 7,314,802 B2 | 1/2008 | Zhu et al. |
| 7,915,112 B2 | 3/2011 | Xu et al. |
| 8,183,627 B2 | 5/2012 | Currie |
| 8,362,566 B2 | 1/2013 | Rakshit et al. |
| 8,405,131 B2 | 3/2013 | Yang |
| 8,492,852 B2 | 7/2013 | Chen et al. |
| 8,581,350 B2 | 11/2013 | Matsuki |

(Continued)

OTHER PUBLICATIONS

Eneman, G., et al., "On the Efficiency of Stress Techniques in Gate-Last N-Type Bulk FinFETs", Proceedings of the European Solid State Devise Research Conference, Sep. 12-16, 2011, pp. 1-4.

(Continued)

*Primary Examiner* — George Fourson, III
(74) *Attorney, Agent, or Firm* — Fleit Gibbons Gutman Bongini Bianco PL; Thomas S. Grzesik

(57) ABSTRACT

Various embodiments disclose a method for fabricating one or more vertical fin field-effect-transistors. In one embodiment, a spacer layer is formed in contact with at least one fin structure. The at least one fin structure contacts a source/drain layer formed on a substrate and includes a channel material. A high-k dielectric layer is formed in contact with the spacer layer and the at least one fin structure. A work function metal layer is formed in contact with and conforms to the high-k dielectric layer. A metal gate layer is formed in contact with the work function metal layer. The metal gate layer includes an intrinsic stress inducing a stress on the at least one fin structure.

20 Claims, 18 Drawing Sheets

(56) References Cited

U.S. PATENT DOCUMENTS

| | | | |
|---|---|---|---|
| 2004/0232480 A1* | 11/2004 | Ohta | H01L 27/0688 257/328 |
| 2007/0099353 A1* | 5/2007 | Thean | H01L 21/845 438/149 |
| 2009/0166725 A1* | 7/2009 | Lee | H01L 29/165 257/329 |
| 2010/0072553 A1 | 3/2010 | Xu et al. | |
| 2010/0207201 A1* | 8/2010 | Masuoka | H01L 27/0207 257/329 |
| 2010/0308381 A1* | 12/2010 | Luning | H01L 21/845 257/288 |
| 2010/0308409 A1* | 12/2010 | Johnson | H01L 21/3086 257/368 |
| 2011/0068418 A1* | 3/2011 | Lung | B82Y 10/00 257/413 |
| 2011/0263099 A1* | 10/2011 | Nojima | H01L 27/10876 438/478 |
| 2012/0202327 A1* | 8/2012 | Lehnert | H01L 21/0245 438/270 |
| 2013/0181299 A1* | 7/2013 | Baldauf | H01L 29/66545 257/401 |
| 2014/0264489 A1* | 9/2014 | Wong | H01L 29/785 257/288 |
| 2016/0336324 A1* | 11/2016 | Li | H01L 27/0928 |

OTHER PUBLICATIONS

Vink, T.J., et al., "Stress, strain, and microstructure in thin tungsten films deposited by dc magnetron sputtering", Journal of applied physics, Jul. 15, 1993, pp. 1-8, vol. 74, No. 2.

* cited by examiner

TENSILE AND COMPRESSIVE FINS FOR VERTICAL FIELD EFFECT TRANSISTORS

BACKGROUND OF THE INVENTION

The present disclosure generally relates to the field of semiconductors, and more particularly relates to vertical field-effect-transistors.

Vertical transistors are a promising option for technology scaling for 5 nm and beyond. However, in many instances such as when generating channel stress, conventional fabrication processes are not applicable to vertical transistors.

SUMMARY OF THE INVENTION

In one embodiment, a method for one or more vertical fin field-effect-transistors is disclosed. The method comprises forming a spacer layer in contact with at least one fin structure. The at least one fin structure contacts a source/drain layer formed on a substrate and comprises a channel material. A high-k dielectric layer is formed in contact with the spacer layer and the at least one fin structure. A work function metal layer is formed in contact with and conforms to the high-k dielectric layer. A metal gate layer is formed in contact with the work function metal layer. The metal gate layer comprises an intrinsic stress inducing a stress on the at least one fin structure.

In another embodiment, a vertical field-effect transistor is disclosed. The vertical field-effect transistor comprises a substrate and a source/drain layer formed on the substrate. At least one fin structure is formed in on the source/drain layer. A spacer layer is formed in contact with the least one fin structure. A high-k dielectric layer is formed in contact with the spacer layer and the at least one fin structure. A work function metal layer is formed in contact with and conforming to the high-k dielectric layer. A metal gate layer is formed in contact with the work function metal layer. The metal gate layer comprises an intrinsic stress of a first type, where the at least one fin structure comprises an induced stress of a second type.

In a further embodiment, a semiconductor structure is disclosed. The semiconductor structure comprises a plurality of vertical field-effect transistors. Each vertical field-effect transistor in the plurality of vertical field-effect transistors comprises a substrate and a source/drain layer formed on the substrate. At least one fin structure is formed in on the source/drain layer. A spacer layer is formed in contact with the least one fin structure. A high-k dielectric layer is formed in contact with the spacer layer and the at least one fin structure. A work function metal layer is formed in contact with and conforming to the high-k dielectric layer. A metal gate layer is formed in contact with the work function metal layer. The metal gate layer comprises an intrinsic stress of a first type, where the at least one fin structure comprises an induced stress of a second type.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
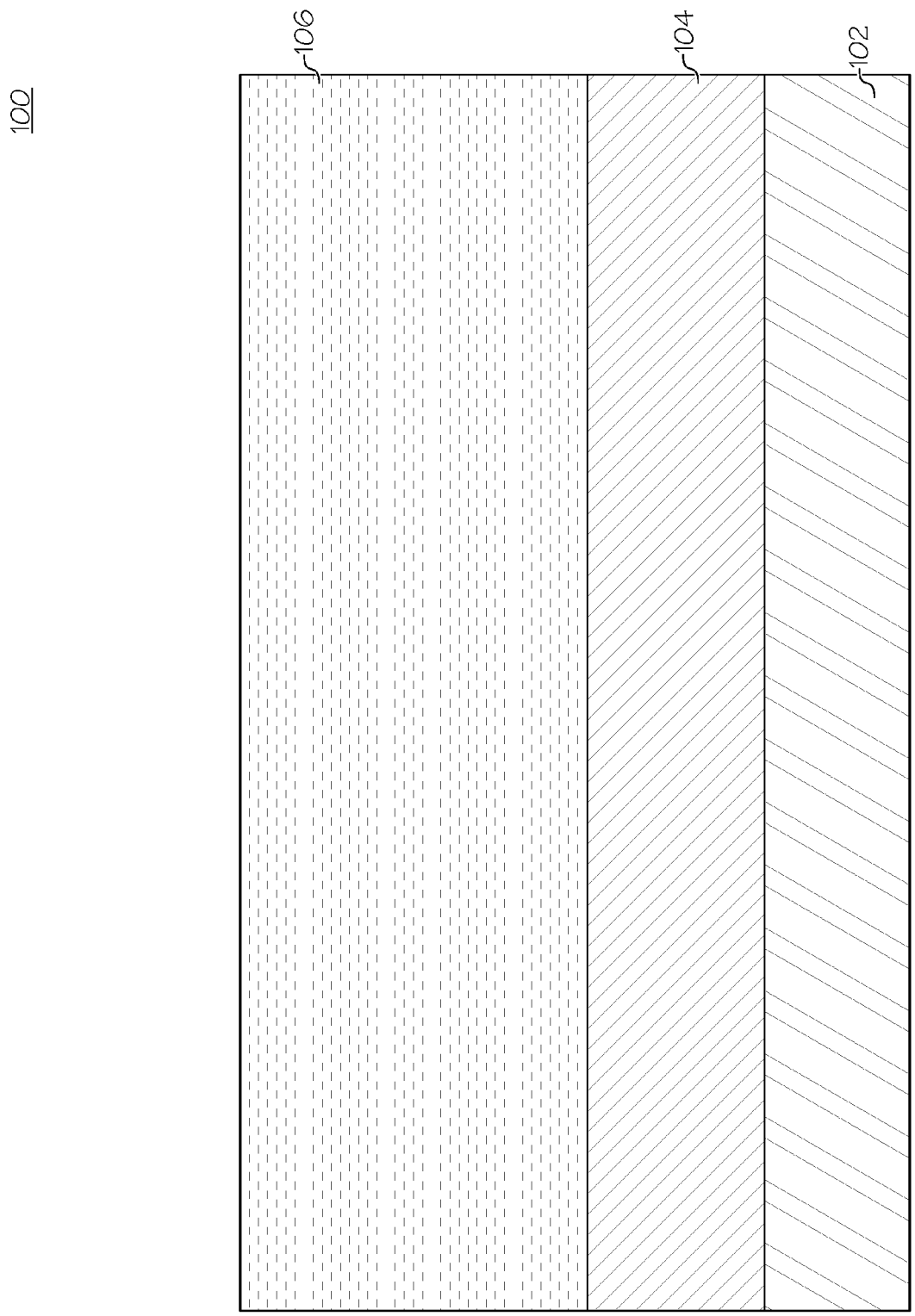
FIG. 1 is a cross-sectional view of an initial semiconductor structure according to one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-17 illustrate various processes for fabricating tensile and compressive fins for vertical field-effect-transistors (FETs). FIG. 1 shows a partially fabricated semiconductor device 100 comprising a substrate 102, a doped source/drain layer 104, and a channel layer 106. The thickness of the substrate 102 can be, for example, from 50 microns to 1,000 microns, although lesser and greater thicknesses can be employed as well. The substrate 102 can be single crystalline and or a bulk substrate, a semiconductor-on-insulator (SOI) substrate, or a hybrid substrate. An insulator layer (not shown) comprising a dielectric material such as silicon oxide, silicon nitride, silicon oxynitride, or any combination thereof can be formed on an in contact with the substrate 102.

The substrate 102 can be appropriately doped either with p-type dopant atoms and/or with n-type dopant atoms, or the material can be substantially undoped (intrinsic). The dopant concentration of the substrate 102 can be from $1.0 \times 10^{15}/cm^3$ to $1.0 \times 10^{19}/cm^3$ and in one embodiment, is from $1.0 \times 10^{16}$ $cm^3$ to $3.0 \times 10^{18}/cm^3$, although lesser and greater dopant concentrations are applicable as well. An optional counter-doped layer (not shown) can be formed on and in contact with the substrate 102 (or buried insulator layer if formed). The counter-doped layer, in one embodiment, is formed by an epitaxial growth of a semiconductor material. The counter-doped layer may be implanted with dopants and annealed using, for example, rapid thermal anneal. Alternatively, the counter-doped layer can be doped in-situ during the epitaxial growth. The purpose of the counter-doped layer is to provide isolation between one transistor and the next transistor.

The source/drain layer 104 is formed on and in contact with the substrate 102 (or counter-doped layer if formed). The source/drain layer 104 can be, for example, an n++ doped region or a p++ doped region of the substrate 102 and can have a thickness in a range of, for example, about 10 nm to about 200 nm. However, other thicknesses are applicable as well. The source/drain region can be formed by epitaxial growth. In one embodiment, the channel layer 106 comprises a channel material. The channel material can be formed using an epitaxy process that grows a material up from the source/drain layer 104. The channel material can be undoped or doped with either p-type or n-type dopants through ion implantation, plasma doping, or gas phase doping. P-type transistors are produced by doping the channel material with elements from group III of the periodic table (e.g., boron, aluminum, gallium, or indium). As an example, the dopant can be boron in a concentration ranging from 1×10E17 atoms/cm3 to 1×10E22 atoms/cm3. N-type transistors are produced by doping the channel material with elements from group V of the periodic table (e.g., phosphorus, antimony, or arsenic). As an example, the dopant can be phosphorus in a concentration ranging from 1×10E14 atoms/cm3 to 1×10E20 atoms/cm3.

Figure 2:
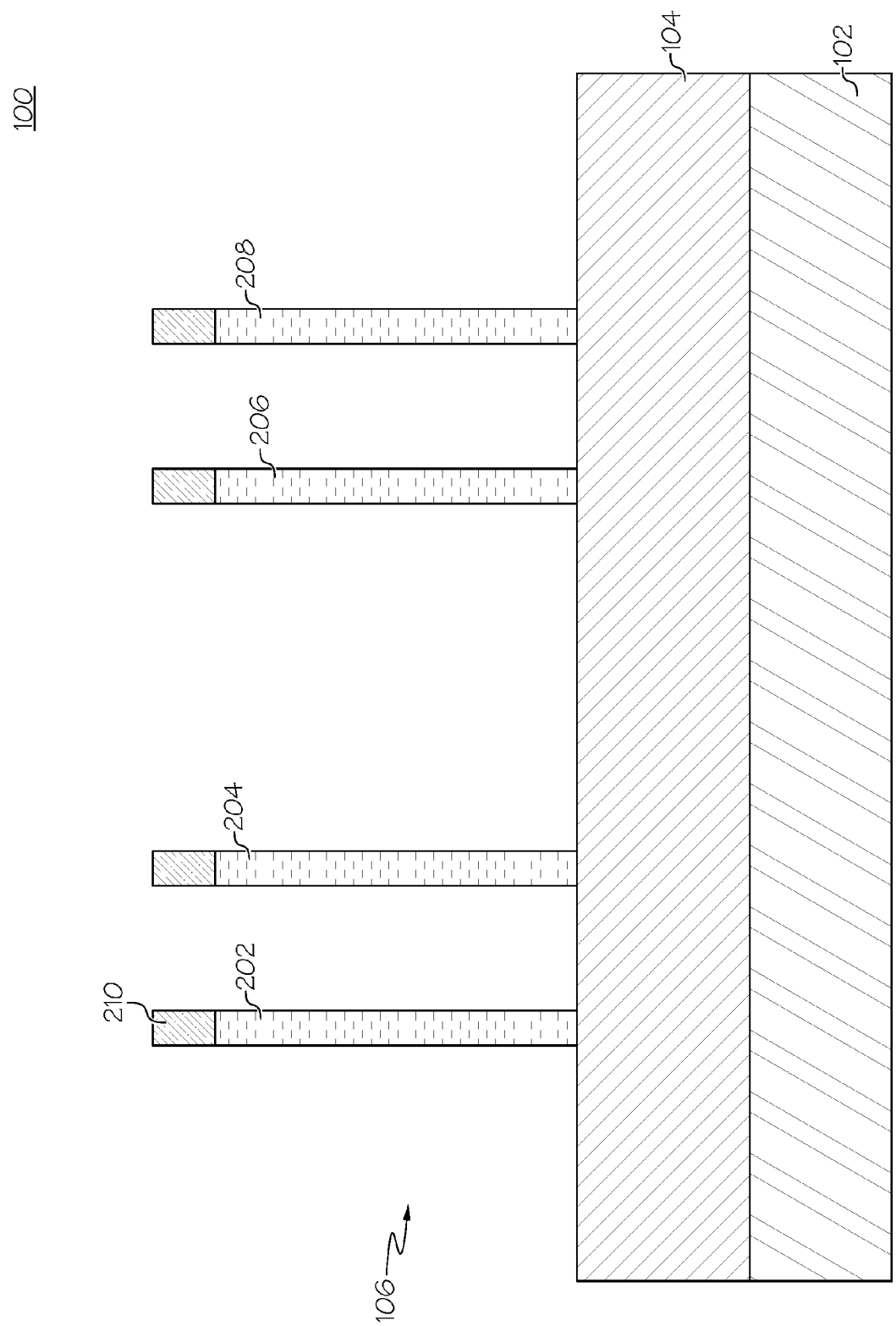
FIG. 2 is a cross-sectional view of the semiconductor structure after fin structures have been formed according to one embodiment of the present disclosure.

FIG. 2 shows the semiconductor device 100 after fin structures 202, 204, 206, 208 have been formed in the channel layer 106. The fins 202, 204, 206, 208 are formed, in one embodiment, by forming an etch-stop capping layer 210 onto the channel material through, for example, deposition. The etch-stop capping layer 210, in one embodiment, may be made of silicon-nitride although other material suitable in providing etch-stop function may be used as well. One or more fin structures 202, 204, 206, 208 are subsequently formed or etched out of the channel material to be on top of and in contact with the source/drain layer 104 through a process involving masking, using industry-standard lithographic techniques, and directionally etching the etch-stop capping layer and underneath channel material. The directional etching process, for example a reactive-ion-etching (RIE) process, stops on the source/drain layer 104. In one embodiment, the fins have a thickness of, for example, 20 nm to 100 nm. After the RIE etching process, the photo-resist mask used in the lithographic etching process can be removed.

Figure 3:
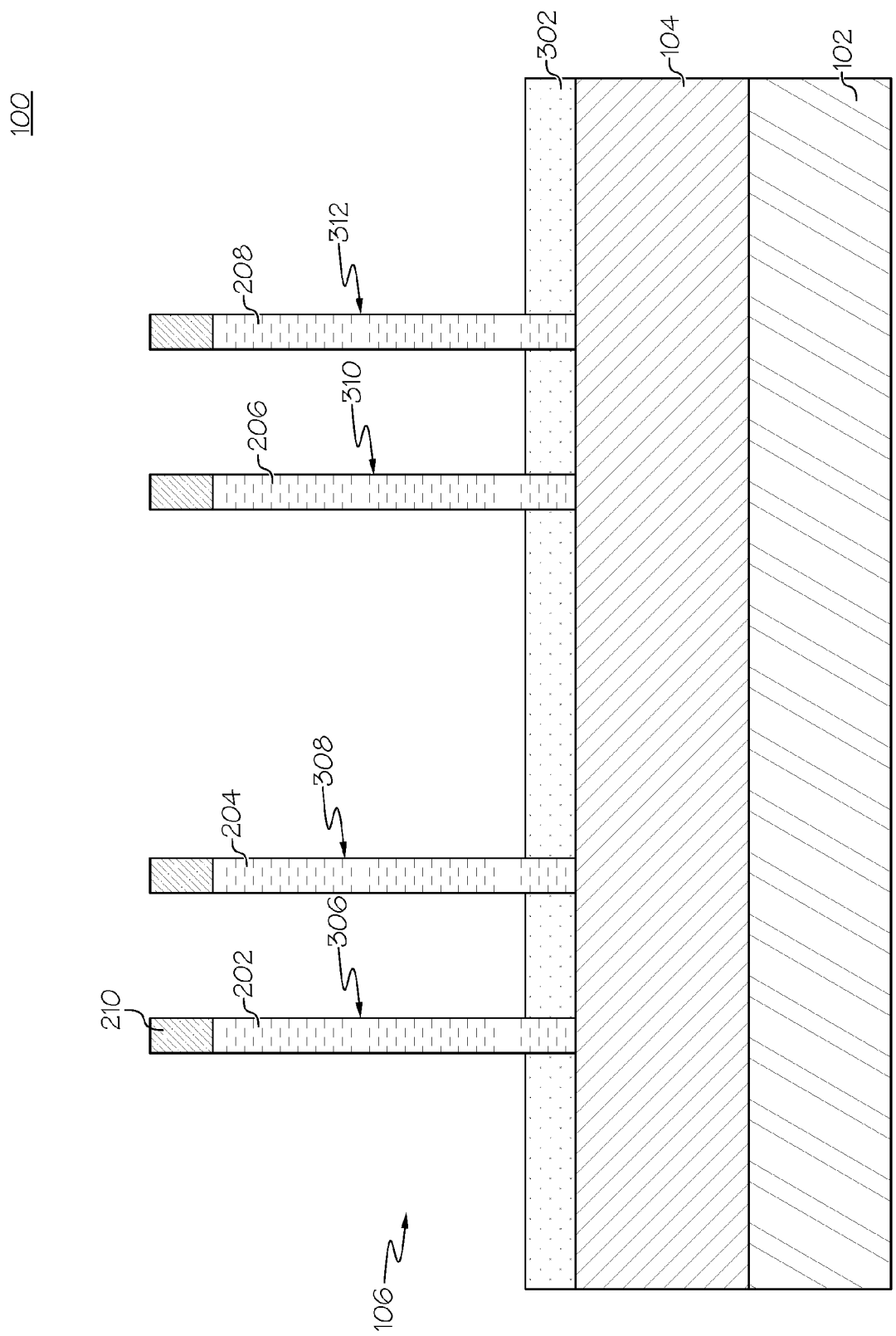
FIG. 3 is a cross-sectional view of the semiconductor structure after a bottom spacers have been formed according to one embodiment of the present disclosure.

After the fins 202, 204, 206, 208 have been formed, bottom spacers 302 are formed in contact with each of the fins fin 202, 204, 206, 208, as shown in FIG. 3. Each bottom spacer 302 contacts a top surface 304 of the source/drain layer 106 and sidewalls 306, 308, 310, 312 of at least one fin 202, 204, 206, 208. In one embodiment, the bottom spacers 302 comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structures. In one embodiment, the spacers have a thickness of, for example, 3 nm to 30 nm.

Figure 4:
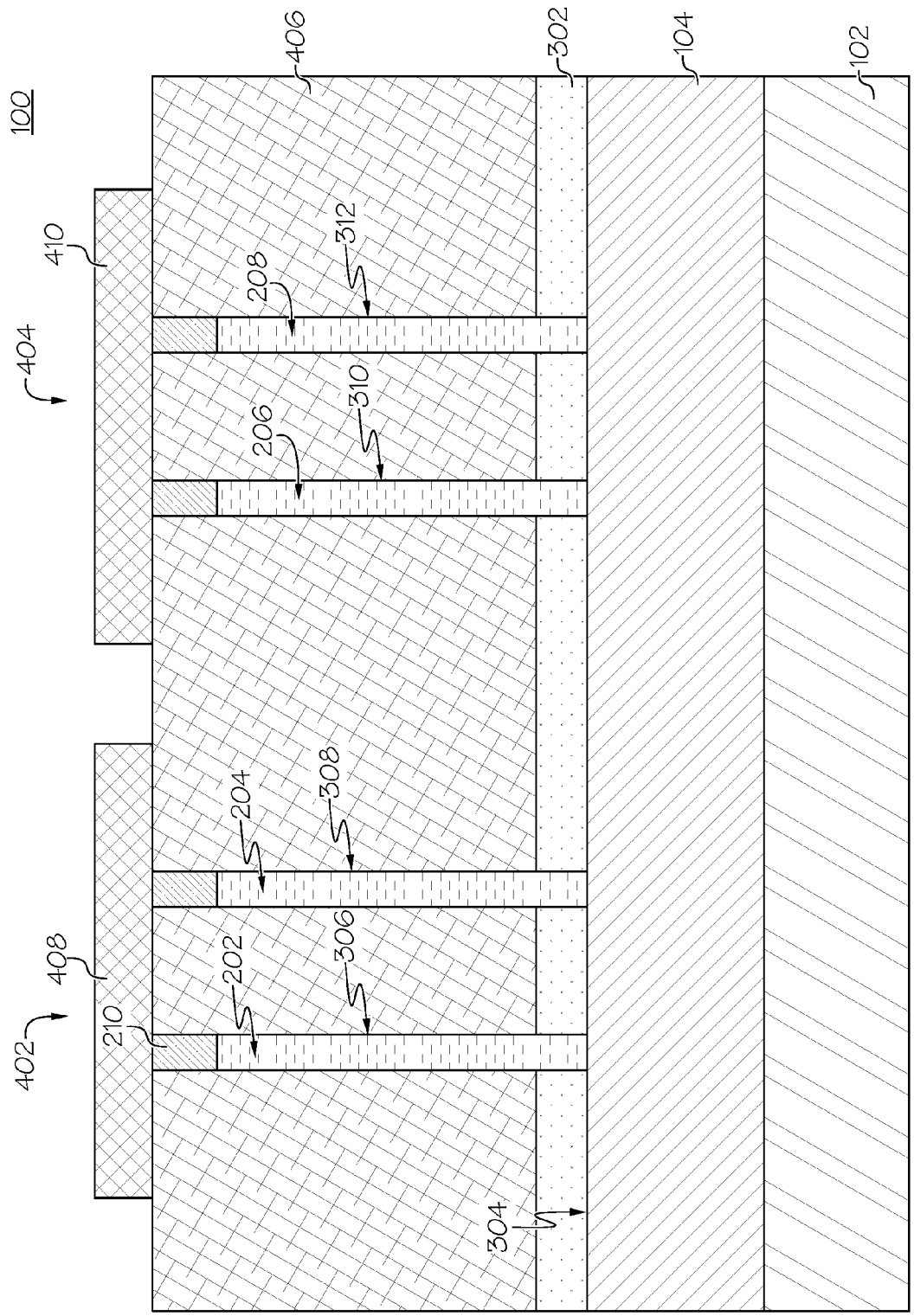
FIG. 4 is a cross-sectional view of the semiconductor structure after an oxide layer and hard masks have been formed according to one embodiment of the present disclosure.
Figure 5:
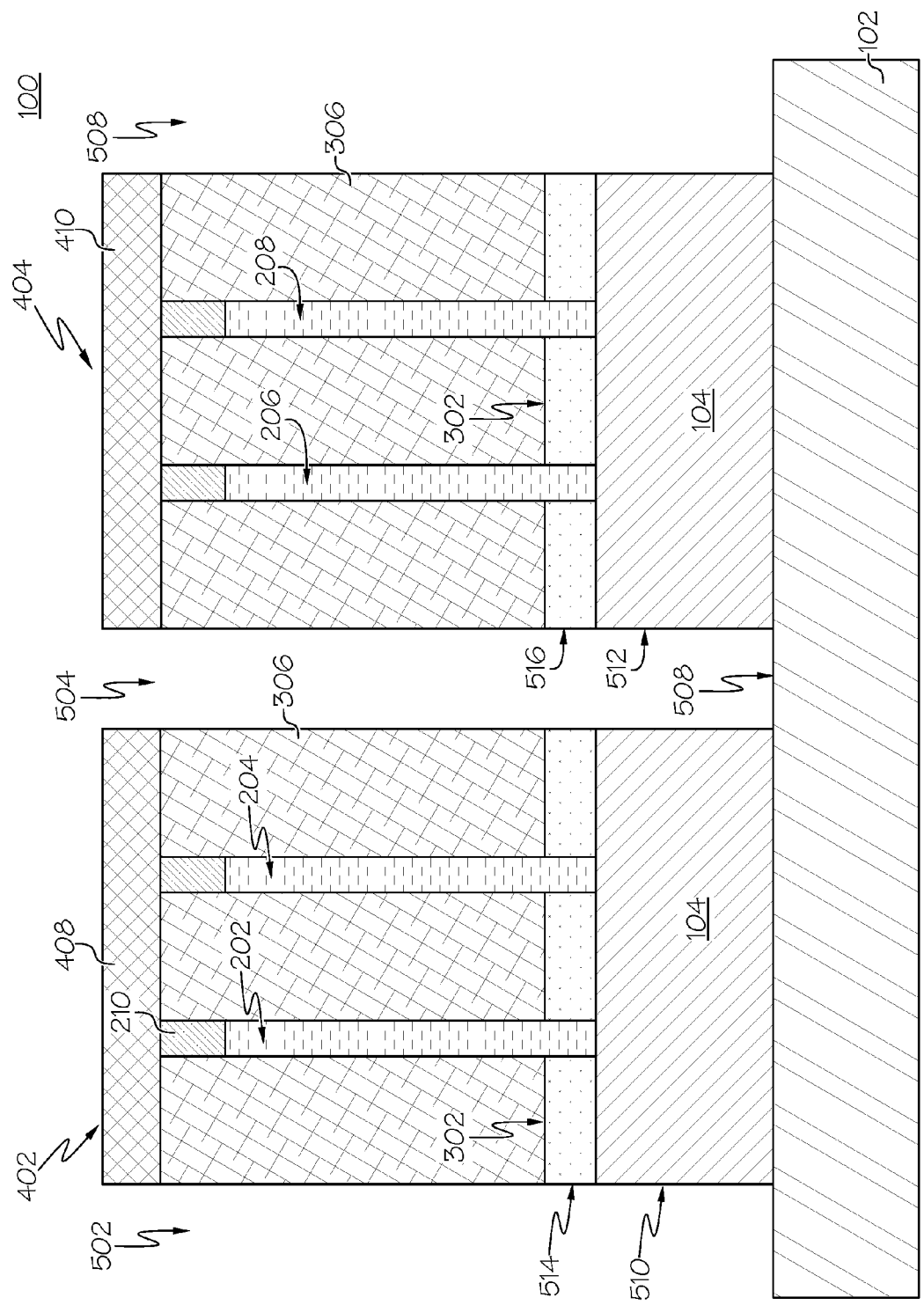
FIG. 5 is a cross-sectional view of the semiconductor structure after exposed portions of the structure have been etched down to the substrate according to one embodiment of the present disclosure.
Figure 6:
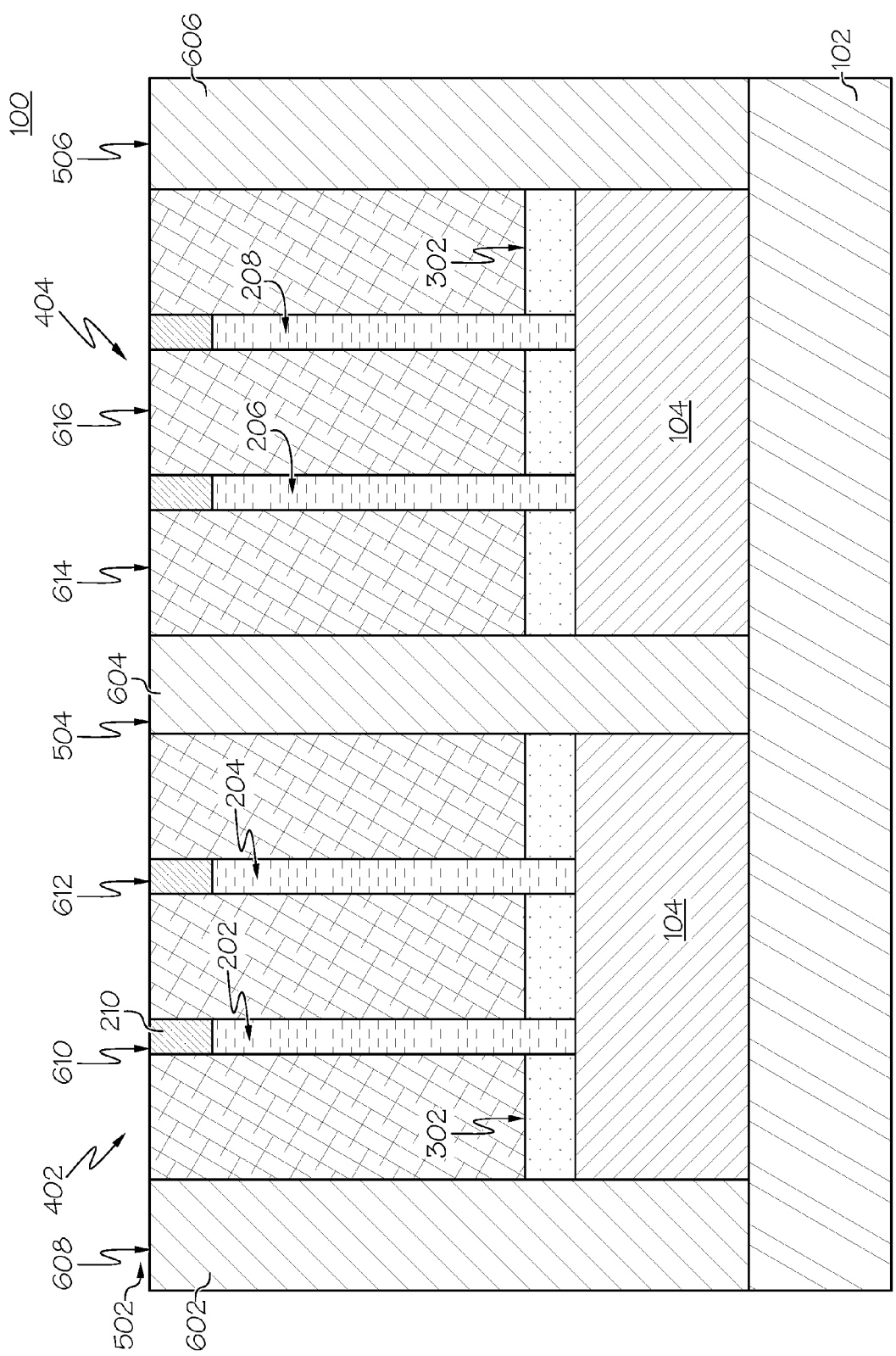
FIG. 6 is a cross-sectional view of the semiconductor structure after isolation regions have been formed according to one embodiment of the present disclosure.

The various device regions 402, 404 within the structure 100 are then isolated from each other. For example, FIG. 4 shows that a flowable oxide 406 is deposited over the structure 100 and then a hard mask 408, 410 is formed over an nFinFet region 402 and a pFinFet region 404. The hard masks 408, 410 can be formed by, for example, depositing, and a suitable hard mask material, such as silicon nitride, onto the flowable oxide 406 and then patterned using standard lithography and etching techniques. Trenches 502, 504, 506 are then formed within the exposed oxide 406 down to the substrate 102, as shown in FIG. 5. The trenches 502, 504, 506 expose a top surface 508 of the substrate 102, sidewalls 510, 512 of the source/drain layer 106, and sidewalls 514, 516 of a portion of the spacer layer 302. Shallow trench isolation (STI) oxide is then deposited within the deep trenches regions forming STI regions 602, 604, 606, as shown in FIG. 6. The masks 408, 410, flowable oxide 406, and excess STI oxide are removed via chemical-mechanical polishing (CMP), selective etching, and/or the like. The resulting STI regions 602, 604, 606 comprise a top surface 608 that is co-planar with a top surface 610, 612, 614, 616 of the fins 202, 204, 206, 208 or their hard masks 210 (if present).

Figure 7:
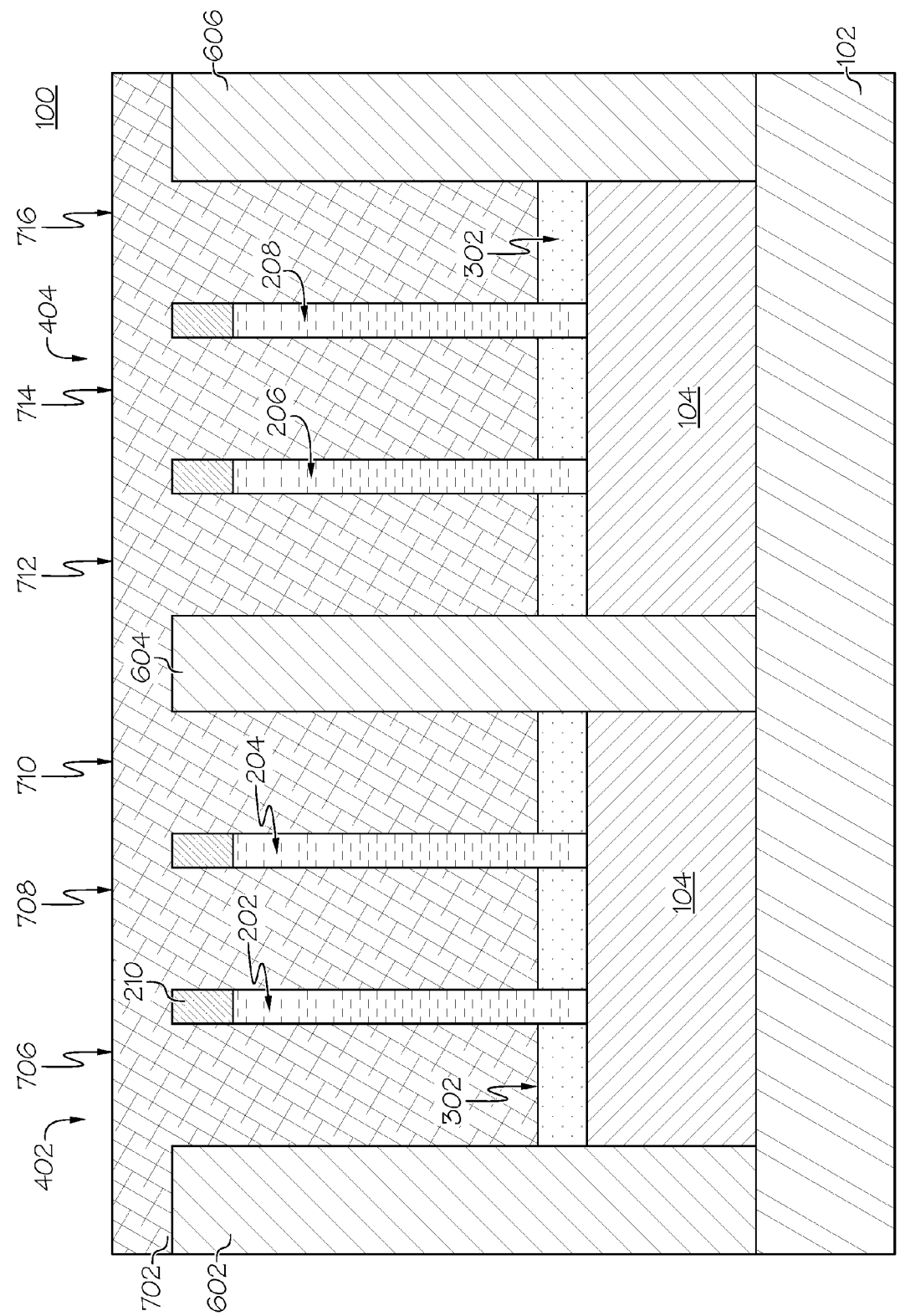
FIG. 7 is a cross-sectional view of the semiconductor structure after a high-k dielectric layer has been formed according to one embodiment of the present disclosure.
Figure 8:
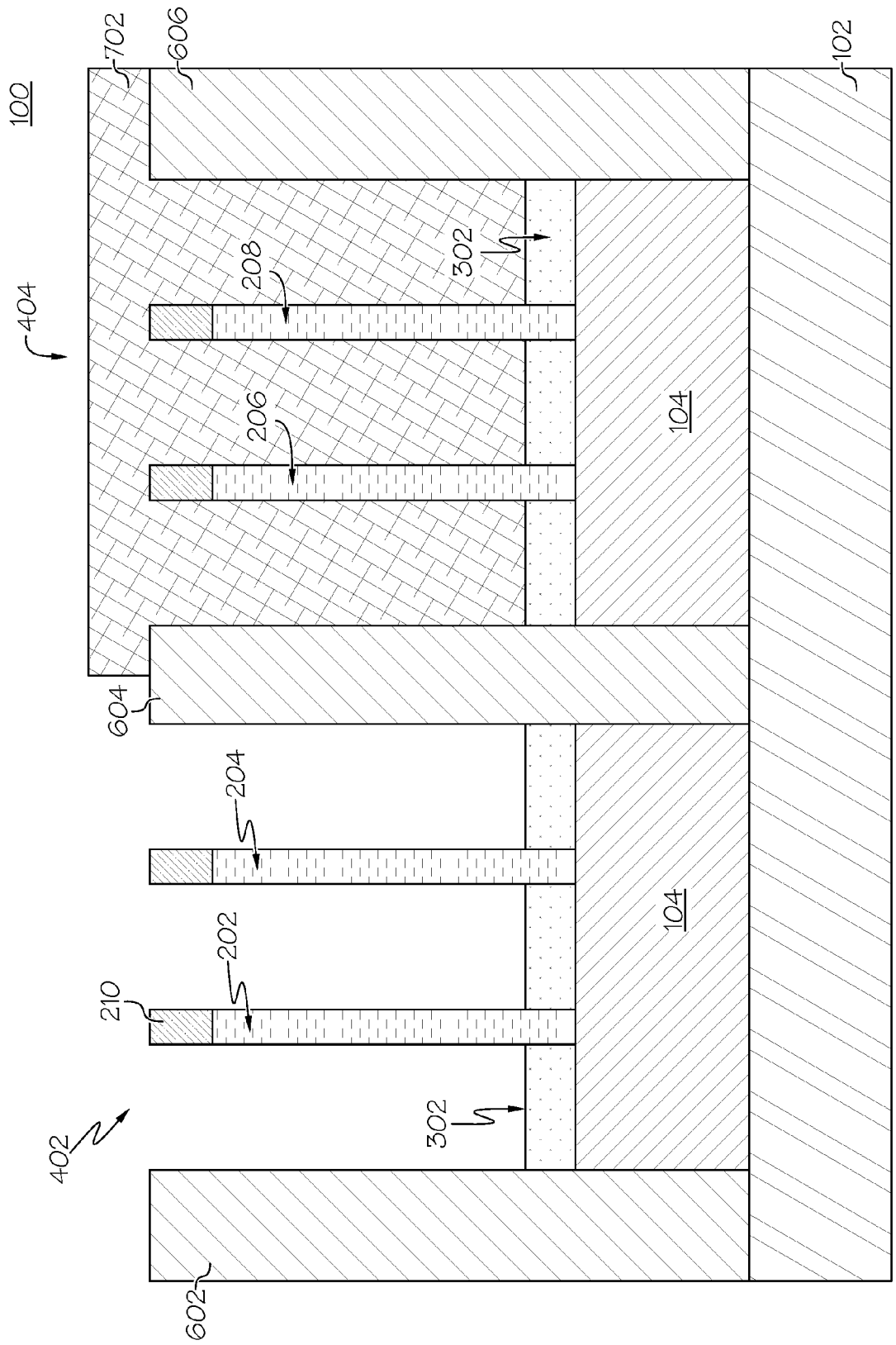
FIG. 8 is a cross-sectional view of the semiconductor structure after a work function metal layer has been formed in contact with the high-k dielectric layer according to one embodiment of the present disclosure.

A dummy gate 702 is then formed over the structure 100, as shown in FIG. 7. The dummy gate 702 is formed in contact with sidewalls of the STI regions 602 604, 606; a top surface 704 of the spacers 302; and sidewalls of the fins 202, 204, 206, 208. The dummy gate 702 also fills gate regions 706 to 716. In one embodiment, the dummy gate 702 comprises polysilicon, amorphous silicon, nitride, or a combination thereof, and can be formed by CVD processes, thermal oxidation, or wet chemical oxidation. It should be noted that in some embodiments, a separate dummy gate is not required and the flowable oxide 406 can be maintained and acts as the dummy gate. Once the dummy gate 702 has been formed, exposed portions of the dummy gate 702 within the first region 402 of the structure 100 are the selectively removed, as shown in FIG. 8. For example, a hard mask (not shown) is formed over and in contact with the portion of the dummy gate 702 in the second region 404 using industry-standard patterning and lithographic techniques, and then dummy gate 702 within the first region 402 of the structure 100 is removed.

Figure 9:
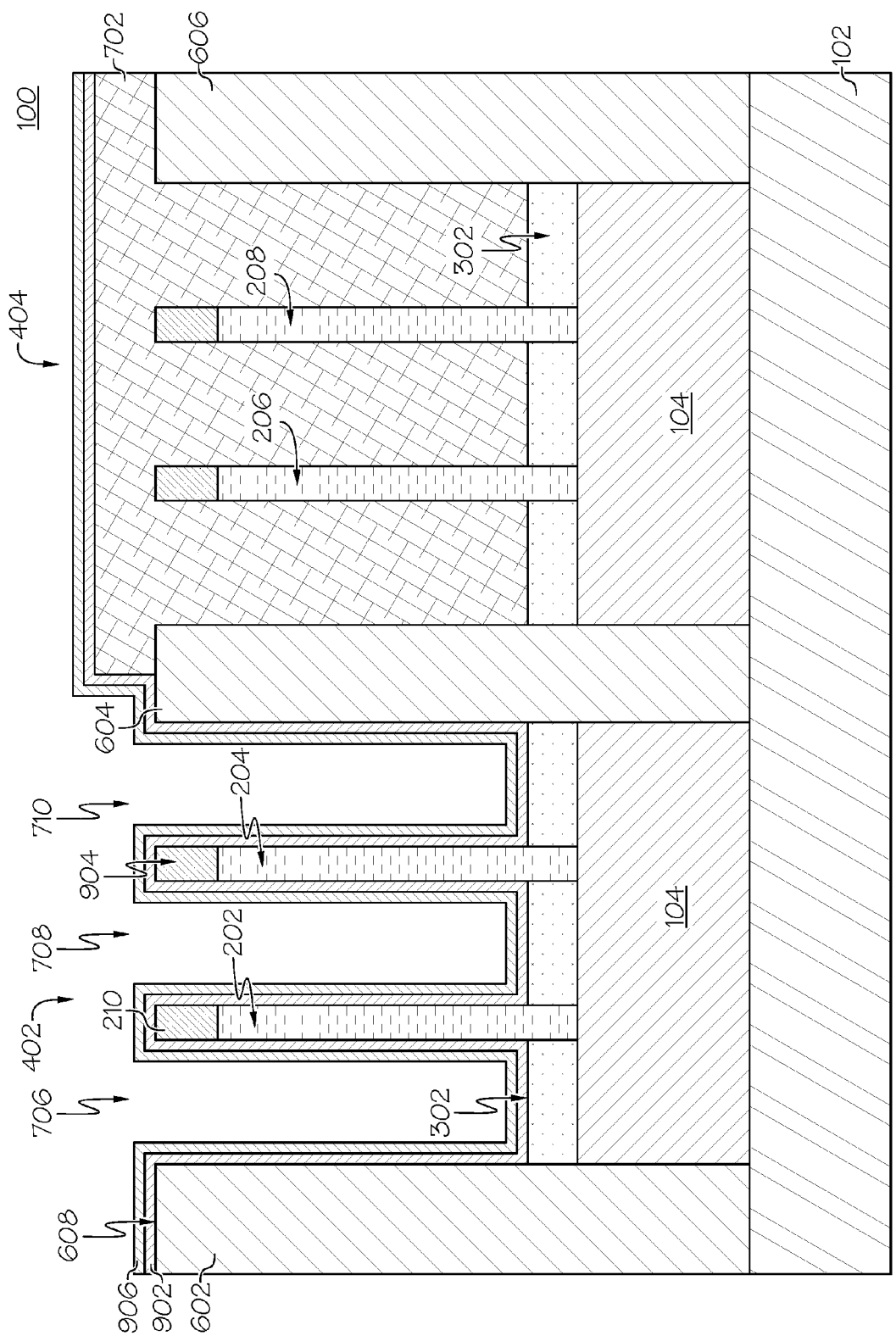
FIG. 9 is a cross-sectional view of the semiconductor structure after a dummy gate has been formed within gate regions of the structure according to one embodiment of the present disclosure.

The hard mask is then removed and a high-k dielectric material is then blanket deposited over the entire structure 100, for example by CVD (chemical vapor deposition), PECVD (plasma enhanced chemical vapor deposition), or ALD (Atomic layer deposition). The high-k gate material forms a high-k gate dielectric layer 902, as shown in FIG. 9. This layer 902 is formed on, in contact with, and conforming to a top surface 608 of one or more of the STI regions 602, 604, 608; a top surface 904 of the fin hard masks 210 within the first region 402; sidewalls of the STI regions 602, 604 within the first region 402; sidewalls of the fins 202, 204 within the first region 402; a top surface 704 of the spacers 302 within the first region 402; and the portion of the dummy gate 702 within the second region 404. In one embodiment, the high-k dielectric layer 902 forms a "U" shape" within the gate regions 706, 708, 710 of the first region 402. The high-k gate dielectric layer 902 can have a thickness, for example, between 0.1 nm and 3 nm.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layer 902 may further include dopants such as lanthanum or aluminum.

A conformal work function metal layer 906 is then subsequently formed over, in contact with, and conforming to the high-k gate dielectric layer 902 employing CVD, sputtering, or plating. The work function metal layer 906 includes one or more metals having a function suitable to tune the work function of nFinFETs in the nFinFET region 402. Exemplary metals that can be employed in the work function metal layer include, but are not limited to titanium, titanium nitride, titanium carbide, titanium aluminum nitride, rubidium, platinum, molybdenum, cobalt, and alloys and combinations. The thickness of the first work function metal layer can be from 3 nm to 15 nm, although lesser and greater thicknesses can also be employed.

Figure 10:
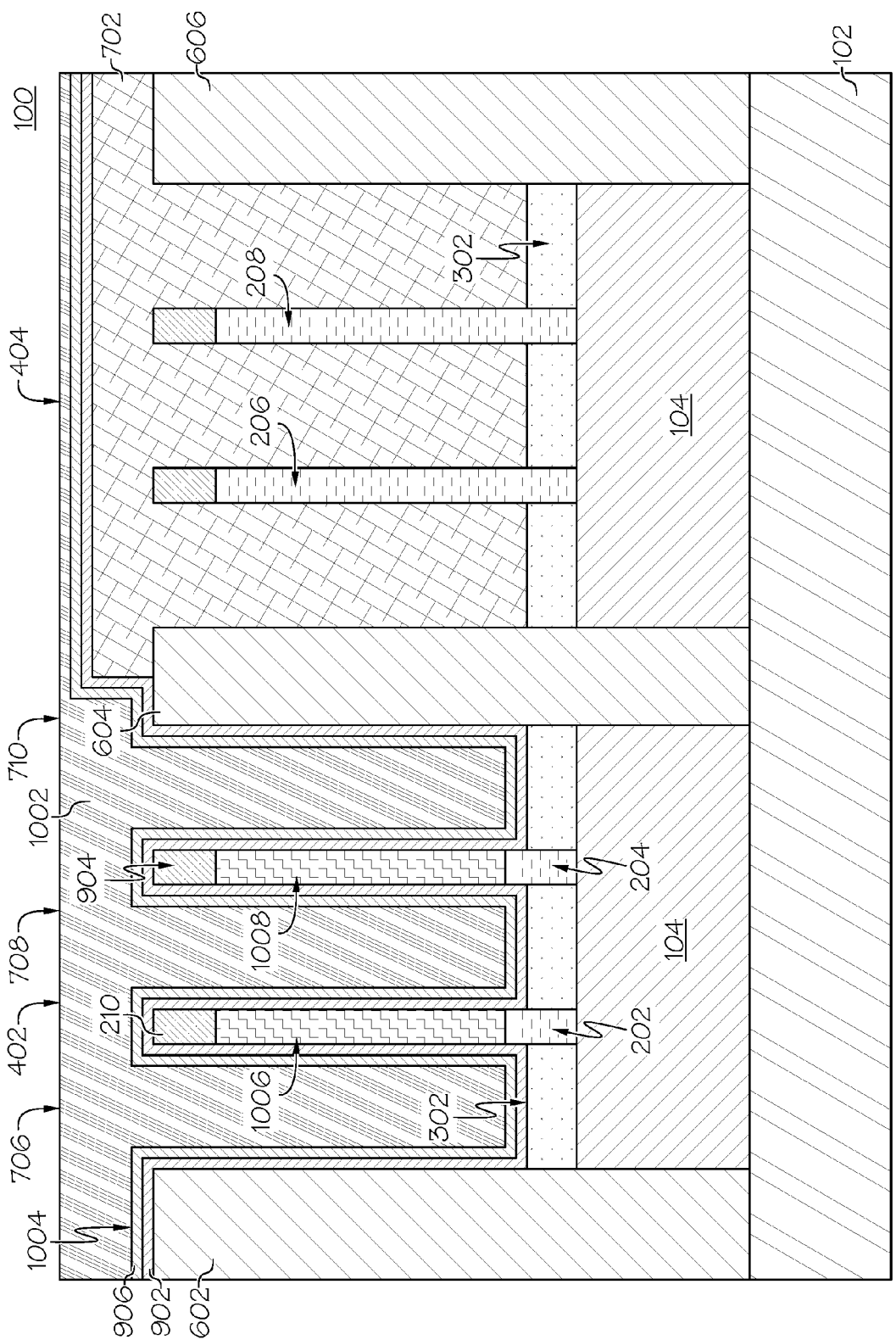
FIG. 10 is a cross-sectional view of the semiconductor structure after a portion of the dummy gate within a first device region of the structure has been removed according to one embodiment of the present disclosure.

A tensile metal gate material 1002 is then deposited over the structure 100, as shown in FIG. 10. In one embodiment, the tensile metal gate material 1002 comprises tungsten with an intrinsic tensile stress ranging from, for example, 0.2 GPa to 2 GPa. The tensile metal gate material 1002 is deposited utilizing, for example, a PVD process such as magnetron sputtering. FIG. 10 shows that the tensile metal gate material 1002 contacts the entire top surface 1004 of the work function metal layer 906 at least within the first region 402 of the structure 100, and is fills the gate regions 706, 708, 710 within the first region 402 of the structure 100. The tensile metal gate material 1002 wraps around the fins 202, 204 within the first region 402 and induces a compressive stress 1006, 1008 along the vertical fin channel within the first region 402. For example, if the tensile metal gate material 1002 comprises an intrinsic tensile stress 0.2 GPa to 2 GPa the vertical fin channels comprise an inducted compressive stress of 0.1 GPa to 1 GPa.

Figure 11:
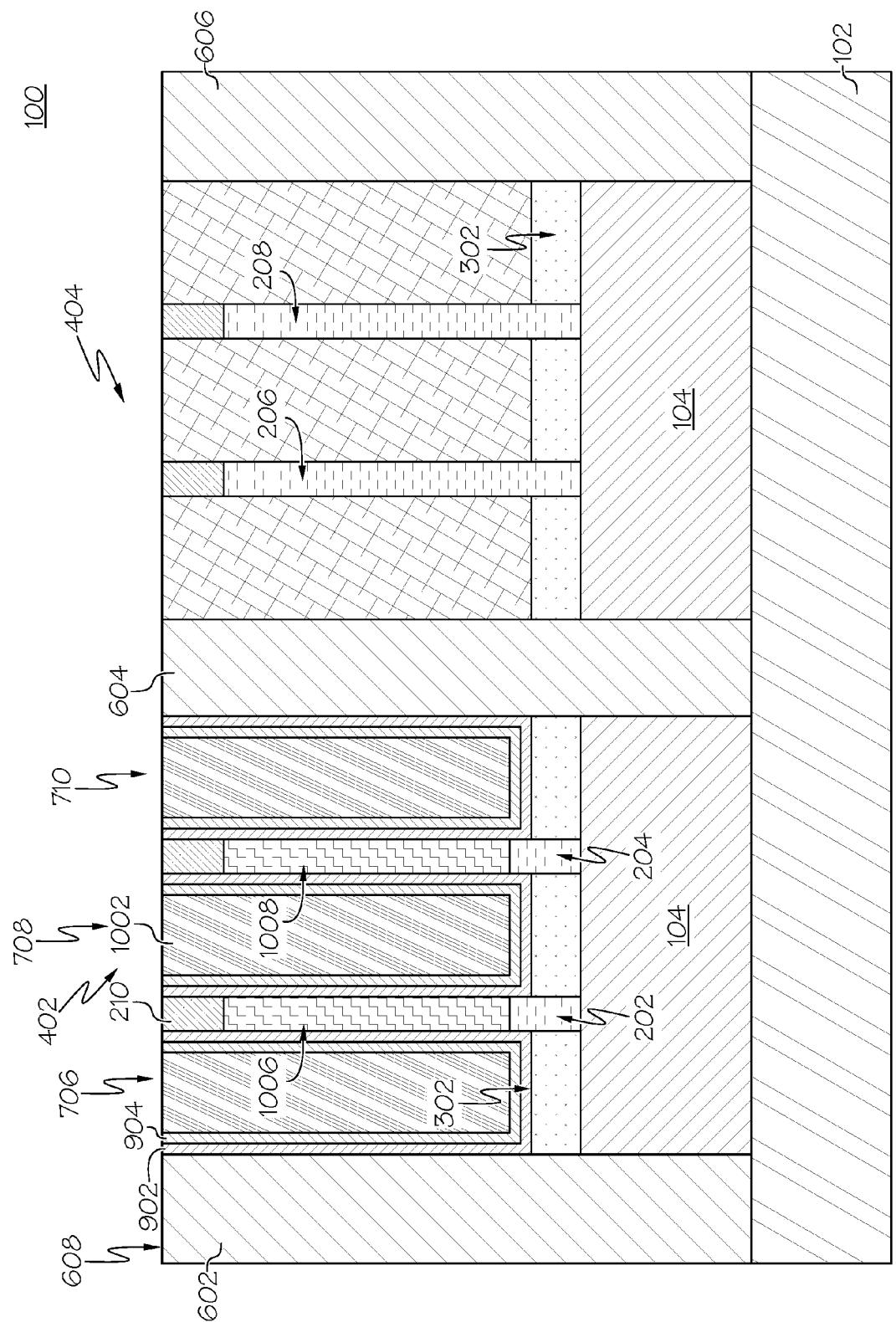
FIG. 11 is a cross-sectional view of the semiconductor structure after a first metal gate comprising an intrinsic stress of a first type has been formed on the first device region of the structure according to one embodiment of the present disclosure.
Figure 12:
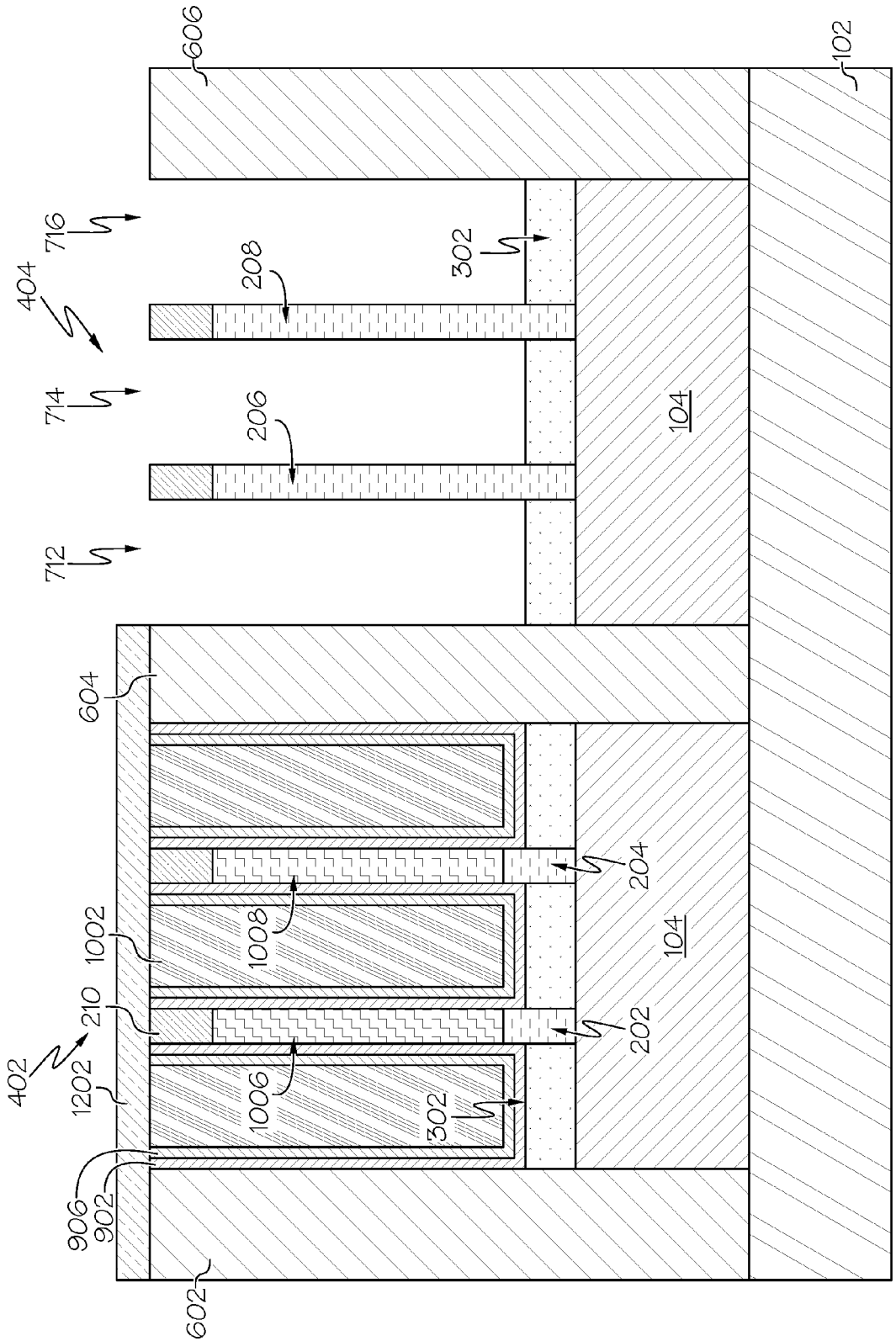
FIG. 12 is a cross-sectional view of the semiconductor structure after the dummy gate within a second device region of the structure has been removed according to one embodiment of the present disclosure.

The tensile metal gate material 1002, the remaining dummy gate 702, the high-k dielectric layer 902, and work function metal layer 906 are then polished using, for example, CMP. This results in the high-k dielectric layer 902, work function metal layer 906, and tensile metal gate material 1002 being co-planar with the top surface 608 of the STI regions 602, 604, 606, as shown in FIG. 11. A hard mask 1202 is then formed over the first region 402 of the structure 100, and the portion of the dummy gate 702 remaining in the second region 404 is removed, as shown in FIG. 12. The hard mask can be formed using industry-standard patterning and lithographic techniques. Removal of the dummy gate 702 exposes the gate regions 712, 714, 716 within the second region 404 of the structure 100.

Figure 13:
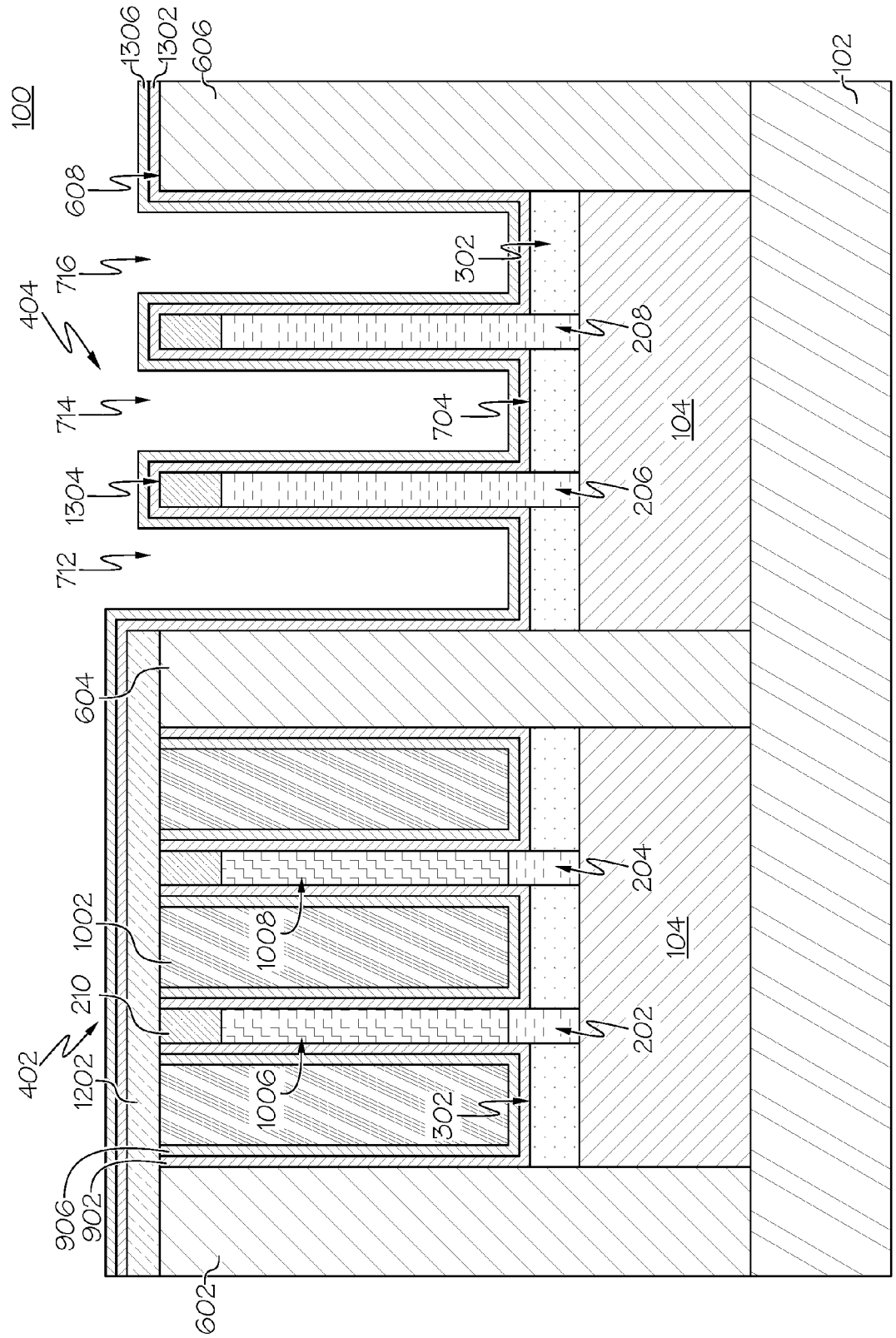
FIG. 13 is a cross-sectional view of the semiconductor structure after a second metal gate comprising an intrinsic stress of a second type has been formed on the second device region of the structure according to one embodiment of the present disclosure.

A high-k dielectric material is then blanket deposited over the entire structure 100, for example by CVD (chemical vapor deposition), PECVD (plasma enhanced chemical vapor deposition), or ALD (Atomic layer deposition). The high-k gate material forms a high-k gate dielectric layer 1302, as shown in FIG. 13. This layer 1302 is formed on, in contact with, and conforming to a top surface 608 of one or more of the STI regions 602, 604, 608; a top surface 1304 of the fin hard masks 210 within the second region 404; sidewalls of the STI regions 604, 606 within the second region 404; sidewalls of the fins 206, 208 within the second region 404; and a top surface 704 of the spacers 302 within the second region 404. In one embodiment, the high-k dielectric layer 1302 forms a "U" shape" within the gate regions 712, 714, 716 of the second region 404. The high-k gate dielectric layer 1302 can have a thickness, for example, between 0.1 nm and 3 nm.

Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layer 1302 may further include dopants such as lanthanum or aluminum.

A conformal work function metal layer 1306 is then subsequently formed over, in contact with, and conforming to the high-k gate dielectric layer 1302 employing CVD, sputtering, or plating. The work function metal layer 1306 includes one or more metals having a function suitable to tune the work function of pFinFETs in the pFinFET region 404. Exemplary metals that can be employed in the work function metal layer include, but are not limited to titanium, titanium nitride, titanium carbide, titanium aluminum nitride, rubidium, platinum, molybdenum, cobalt, and alloys and combinations. The thickness of the first work function metal layer can be from 3 nm to 15 nm, although lesser and greater thicknesses can also be employed.

Figure 14:
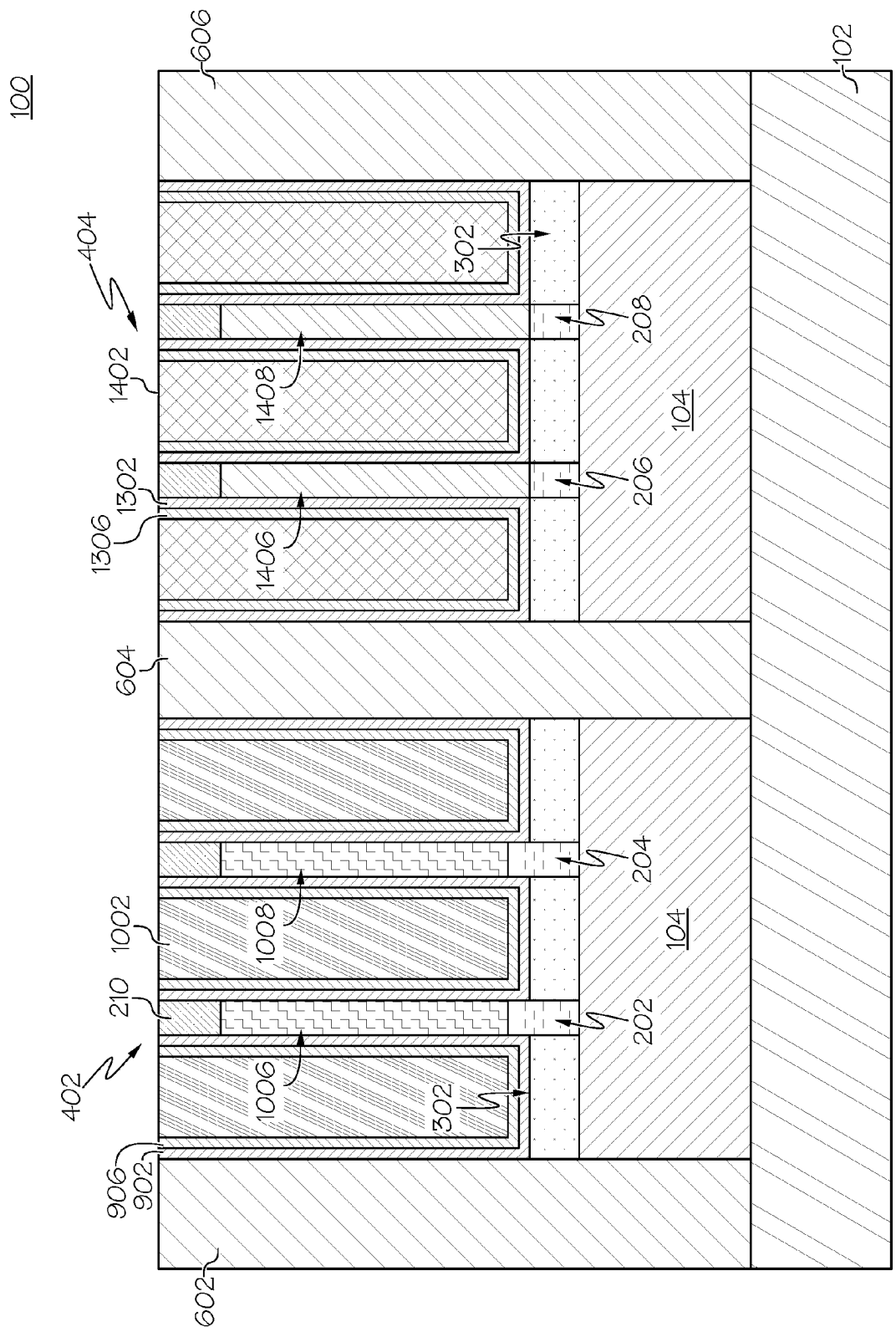
FIG. 14 is a cross-sectional view of the semiconductor structure after the first and second metal gates have been planarized according to one embodiment of the present disclosure.

A compressive metal gate material 1402 is then deposited over the structure 100 and polished back, as shown in FIG. 14. In one embodiment, the compressive metal gate material 1402 comprises tungsten with an intrinsic compressive stress ranging from 0.2 GPa-2 GPa, and is deposited utilizing, for example, a PVD process such as magnetron sputtering. FIG. 14 shows that the compressive metal gate material 1402 fills the gate regions 712, 714, 716 within the second region 404 and contacts the work function metal layer 1306 within the second region 404. The compressive metal gate material 1402 wraps around the fins 206, 208 within the second region 404 and induces a tensile stress 1406, 1408 along the vertical fin channels within the second region 404. For example, if the compressive metal gate material 1402 comprises an intrinsic compressive stress of 0.2 GPa to 2 GPa the vertical fin channels comprise an inducted tensile stress of 0.1 GPa to 1 GPa.

The compressive metal gate material 1402, extraneous high-k dielectric and work function materials 1302, 1306 are then polished using, for example, CMP. This results in the second region high-k dielectric layer 1302, second region work function metal layer 1304, and compressive metal gate material 1402 being co-planar with the top surfaces of the STI regions 602, 604, 606; the first region high-k dielectric layer 902; the first region work function metal layer 906; and the tensile metal gate material 1002. The hard mask 1202 can also be removed as part of the CMP process as well.

It should be noted that in one or more of the embodiments discussed above, the first region high-k dielectric layer 902 and the second region high-k dielectric layer 1302 comprise different materials, and the first region work function metal layer 906 and second region work function metal layer 1306 comprise different materials. However, in some embodiments the high-k dielectric layers 902, 1302 comprise the same material and the work function metal layers 906, 1306 comprise the same material. In these embodiments, the high-k dielectric layers 902, 1302 and the work function metal layers 906, 1306 are formed prior to forming the dummy gate 702. For example, after the flowable oxide 306 is removed in FIG. 6 a single continuous high-k dielectric layer can be deposited conforming to and in contact with the gate regions 706 to 716. Then, a single continuous work function metal layer can be formed in contact with and conforming to the high-k dielectric layer. Once the high-k dielectric and work function metal layers have been deposited, the dummy gate is formed over the structure and within the gate regions of the structure. The portion of the dummy gate within the first region is removed and the tensile metal gate material is deposited within the gate regions of the first region. The remaining portion of the dummy gate within the second region is then removed and the compressive metal gate material is deposited within the gate regions of the second region.

Figure 15:
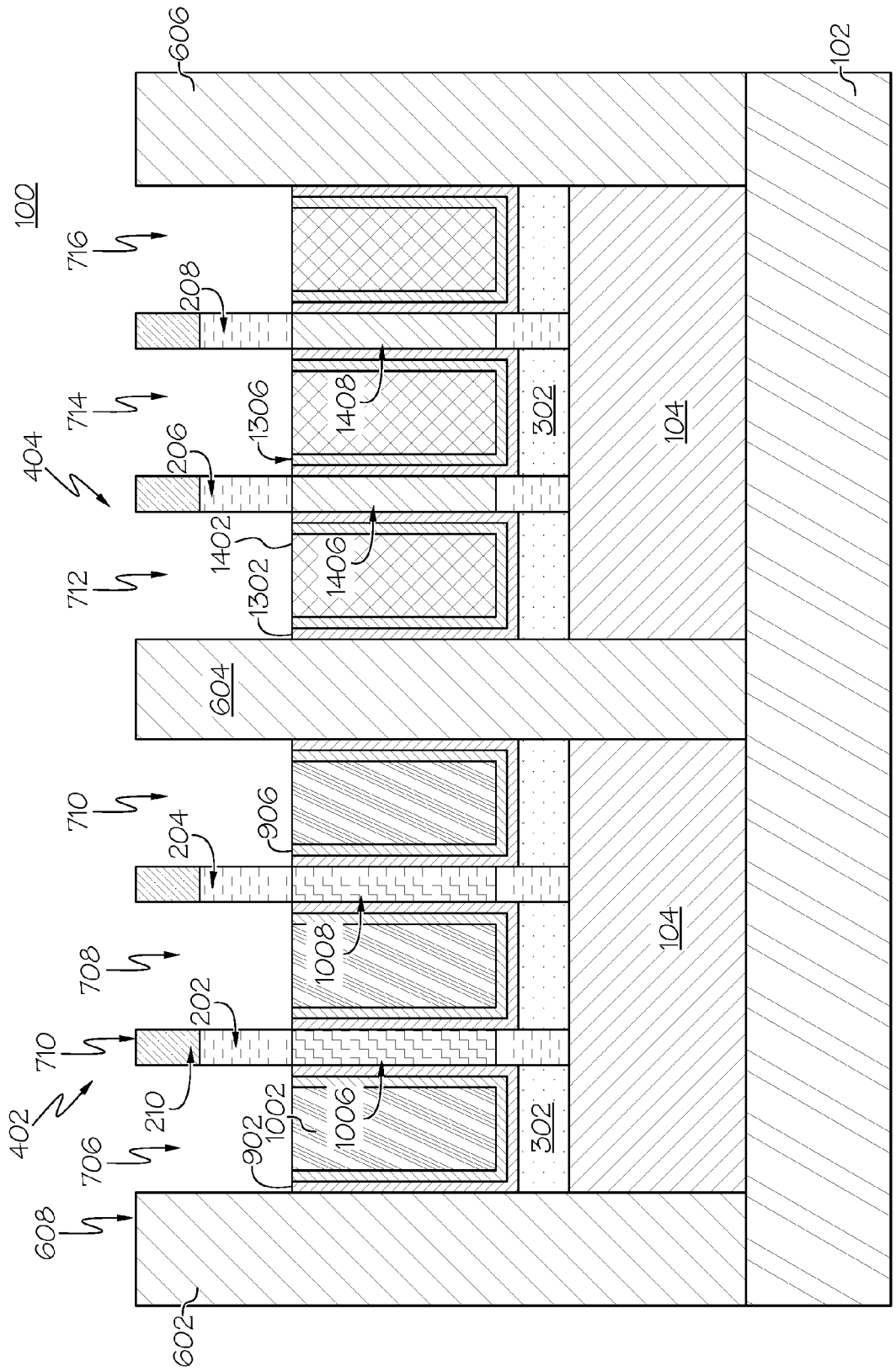
FIG. 15 is a cross-sectional view of the semiconductor structure after the first metal gate, second metal gate, high-k dielectric layer, and work function metal layer have been recessed below a top surface of the fins according to one embodiment of the present disclosure.

Once the tensile metal gate material 902 and the compressive metal gate material 1402 have been deposited and polished FIG. 15 shows that the tensile and compressive metal gate materials 1002, 1402; high-k dielectric layers 902, 1302; and work function metal layers 906, 1306 are then recessed using one or more etching processes resulting in separate tensile gate materials 1002, compressive metal gate materials 1402; high-k dielectric layers 902, 1302; and work function metal layers 906, 1306 in each of the gate regions 706 to 716. In one embodiment, the recess depth is, for example, 20 nm to 100 nm so that the height of the remaining tensile and compressive metal gate materials 1002, 1402 is, for example, 10 nm to 50 nm.

Figure 16:
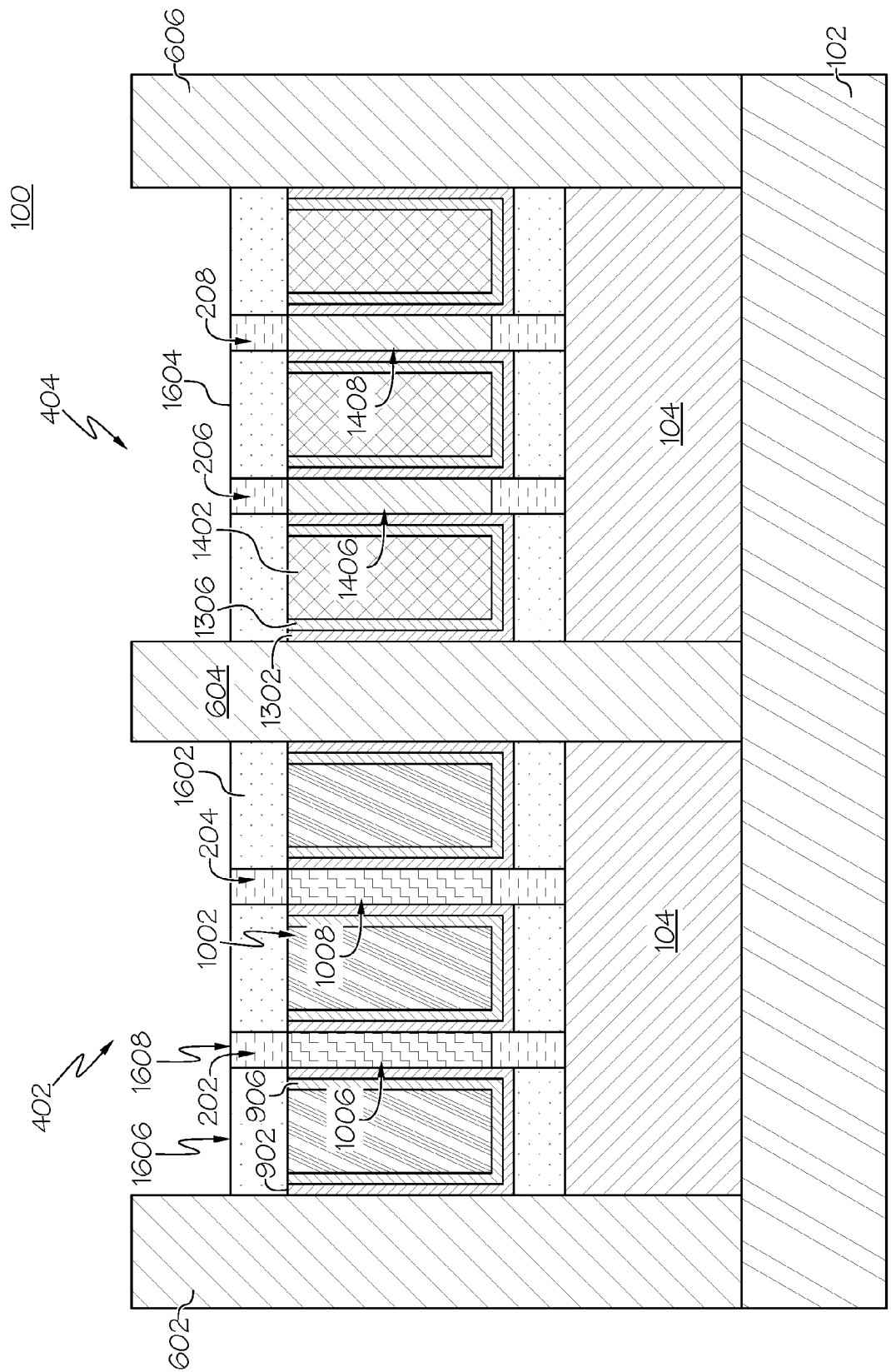
FIG. 16 is a cross-sectional view of the semiconductor structure after a top spacer has been formed according to one embodiment of the present disclosure.

FIG. 16 shows that the fin hard masks 210 are then removed via selective etching and top spacers 1602, 1604 are formed within each of the first and second regions 402, 404 on and in contact with the top surface of the high-k gate dielectric layers 902, 1302; the top surface of the work function metal layers 906, 1306; the top surface of the tensile metal gate material 1002; and the top surface of the compressive metal gate material 1402. The top spacers 1602, 1604 also contact a portion of the sidewalls of the fins 202, 204, 206, 208, and comprise a top surface 1606 that is co-planar with a top surface 1608 of each fin 202, 204, 206, 208.

Figure 17:
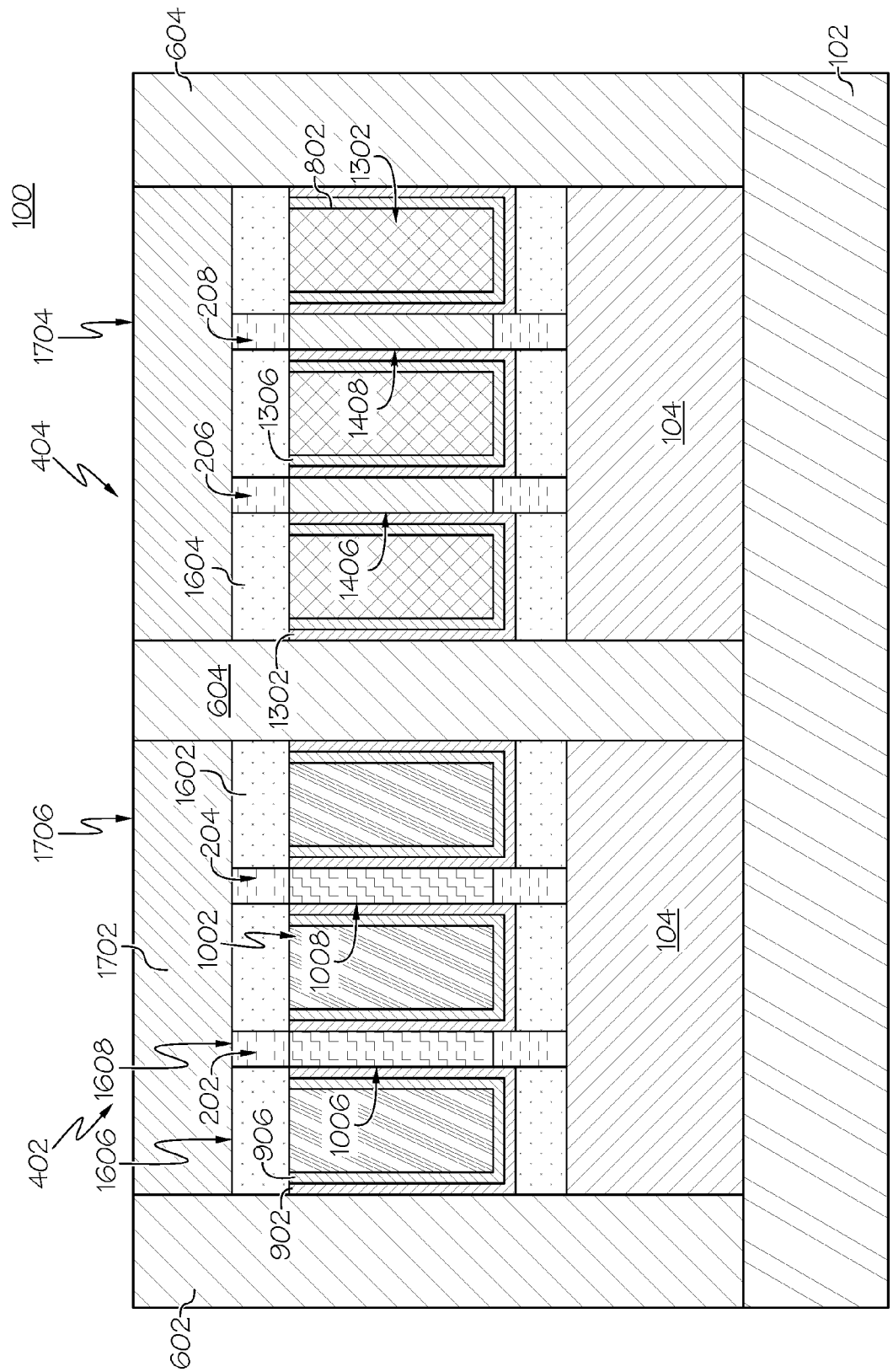
FIG. 17 is a cross-sectional view of the semiconductor structure after drain layers have been formed according to one embodiment of the present disclosure.

Once the second spacers 1602 have been formed a doped source/drain layer 1702, 1704 is formed within each of the first and second regions 402, 404 of the structure 100 as shown in FIG. 17. The source/drain layers 1702, 1704 are formed on and in contact with the top surface 1606 of the top spacer 1602, 1604 and the top surface 1608 of the fins 202, 204, 206, 208. Each source/drain layer 1702, 1704 also contacts a portion of the sidewalls of the STI regions 602, 604, 606 and comprises a top surface 1706 that is co-planar with a top surface 608 of the STI regions 602, 604, 606. The source/drain layers 1702, 1704 can have a thickness in a range of, for example, about 10 nm to about 200 nm. However, other thicknesses are applicable as well. The source/drain layers 1702, 1704 can be formed using an epitaxy process. For example, epitaxy that is selective with respect to the materials of the top spacers 1602, 1604 and fins 202, 204, 206, 208 is used grow material to form the source/drain layers 1702, 1704. The source/drain layers 1702, 1704 comprise in-situ doping (boron, in one embodiment for pFET and phosphorus, in one embodiment, for nFET). It should be noted that, according to one embodiment, the source/drain layers 1702, 1704 may not contain any doping. In the present embodiment, the doping can be performed using any standard approach such as ion implantation. Conventional fabrication processes can then be performed to complete the device(s).

Figure 18:
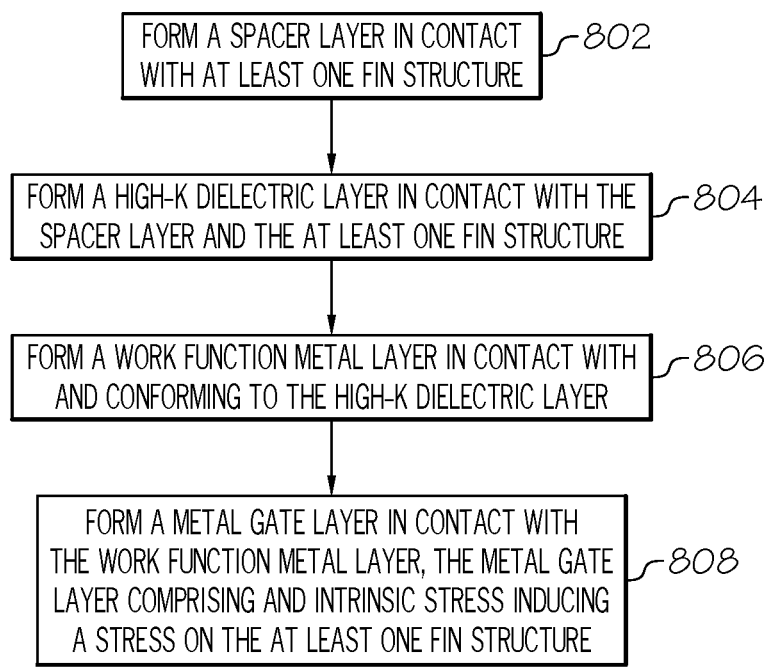
FIG. 18 is an operational flow diagram illustrating one process for fabricating one or more vertical fin field-effect-transistors according to one embodiment of the present disclosure.

FIG. 18 is an operational flow diagram illustrating one process for fabricating one or more vertical fin field-effect-transistors. It should be noted that each of the steps shown in FIG. 18 has been discussed in greater detail above with respect to FIGS. 1-17. A spacer layer 302, at step 1802, is formed in contact with at least one fin structure 1102. The at least one fin structure 1102 is in contact with a source/drain layer 104 formed on a substrate 104 and comprises a channel material. A high-k dielectric layer 702, at step 1804, is formed in contact with the spacer layer 302 and the at least one fin structure 1102. A work function metal layer 802, at step 1806, is formed in contact with and conforming to the high-k dielectric layer 702. A metal gate layer 1002, at step 1808, is formed in contact with the work function metal layer 802. The metal gate layer 1002 comprises an intrinsic stress that induces a stress on the at least one fin structure 1102.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for fabricating one or more vertical fin field-effect-transistors, the method comprising:
    forming a spacer layer in contact with at least one fin structure, the at least one fin structure in contact with a source/drain layer formed on a substrate and comprising a channel material;
    forming a high-k dielectric layer in contact with the spacer layer and the at least one fin structure;
    forming a work function metal layer in contact with and conforming to the high-k dielectric layer; and
    forming a metal gate layer in contact with the work function metal layer, the metal gate layer comprising an intrinsic stress inducing a stress on the at least one fin structure.

2. The method of claim 1, wherein the intrinsic stress is a tensile stress and the induced stress is a compressive stress.

3. The method of claim 1, wherein the intrinsic stress a compressive stress and the induced stress is a tensile stress.

4. The method of claim 1, wherein the metal gate layer comprises tungsten.

5. The method of claim 1, further comprising:
    recessing the high-k dielectric layer, the work function metal layer, and the metal gate layer below a top surface of the at least one fin structure;
    forming a top spacer layer in contact with the high-k dielectric layer, the work function metal layer, the metal gate layer, and the at least one fin structure; and
    forming a source/drain layer in contact with the top spacer layer and the at least one fin structure.

6. The method of claim 1, further comprising:
    prior to forming the high-k dielectric layer and the work function metal layer, forming a dummy gate within a first device region comprising the at least one fin structure and a second device region comprising at least one additional fin structure.

7. The method of claim 6, further comprising:
    removing a portion of the dummy gate formed in the first device region exposing at least a portion of the spacer layer and at least a portion of the at least one fin structure within the first device region,
    wherein forming the high-k dielectric layer comprises forming a first high-k dielectric layer in contact with at least the portion of the spacer layer and the portion of the at least one fin structure that has been exposed,
    wherein forming the work function metal layer comprises forming a first work function metal layer in contact with and conforming to the first high-k dielectric layer, and
    wherein forming the metal gate layer comprises, forming a first metal gate layer in contact with the first work function metal layer, the first metal gate layer comprising a first intrinsic stress inducing a first stress on the at least one fin structure.

8. The method of claim 7, further comprising:
    after forming the first high-k dielectric layer and the first work function metal layer, removing the dummy gate remaining in the second device region exposing at least a portion of the spacer layer and at least a portion of at least one additional one fin structure in the second device region;
    forming a second high-k dielectric layer in contact with at least the portion of the spacer layer and the portion of the additional fin structure that has been exposed in the second device region;
    forming a second work function metal layer in contact with and conforming to the second high-k dielectric layer; and
    forming a second metal gate layer in contact with the second work function metal layer, the second metal gate layer comprising a second intrinsic stress inducing a second stress on the at least one additional fin structure.

9. The method of claim 8, wherein one of:
    the first intrinsic stress of the first metal gate layer is a tensile stress and the first induced stress on the at least one fin structure is a compressive stress, and the second intrinsic stress of the second metal gate layer is a compressive stress and the second induced stress on the at least one additional fin structure is a tensile stress; and the intrinsic stress of the metal gate layer is a compressive stress and the induced stress on the at least one fin structure is a tensile stress, and the intrinsic stress of the additional metal gate layer is a tensile stress and the induced stress on the at least one additional fin structure is a compressive stress.

10. A vertical field-effect transistor comprising:
a substrate:
a source/drain layer formed on the substrate;
at least one fin structure formed in on the source/drain layer;
a spacer layer formed in contact with the least one fin structure;
a high-k dielectric layer formed in contact with the spacer layer and the at least one fin structure;
a work function metal layer formed in contact with and conforming to the high-k dielectric layer; and
a metal gate layer formed in contact with the work function metal layer, wherein the metal gate layer comprising an intrinsic stress of a first type, and wherein the at least one fin structure comprises an induced stress of a second type.

11. The vertical field-effect transistor of claim 10, wherein the intrinsic stress is a tensile stress and the induced stress is a compressive stress.

12. The vertical field-effect transistor of claim 10, wherein the intrinsic stress a compressive stress and the induced stress is a tensile stress.

13. The vertical field-effect transistor of claim 10, wherein the metal gate layer comprises tungsten.

14. The vertical field-effect transistor of claim 10, further comprising:
an additional top spacer layer formed in contact with the high-k dielectric layer, the work function metal layer, the metal gate layer, and the at least one fin structure.

15. The vertical field-effect transistor of claim 14, further comprising:
a drain contact layer in contact with the additional spacer layer and the at least one fin structure.

16. A semiconductor structure comprising:
a plurality of vertical field-effect transistors, wherein each vertical field-effect transistor in the plurality of vertical field-effect transistors comprises:
a substrate:
a source/drain layer formed on the substrate;
at least one fin structure formed in on the source/drain layer;
a spacer layer formed in contact with the least one fin structure;
a high-k dielectric layer formed in contact with the spacer layer and the at least one fin structure;
a work function metal layer formed in contact with and conforming to the high-k dielectric layer; and
a metal gate layer formed in contact with the work function metal layer, wherein the metal gate layer comprising an intrinsic stress of a first type, and wherein the at least one fin structure comprises an induced stress of a second type.

17. The semiconductor structure of claim 16, wherein the intrinsic stress of a first vertical field-effect transistor in the plurality of vertical field-effect transistors is a tensile stress and the induced stress of the at least one fin structure of the first vertical field-effect transistor is a compressive stress, and
wherein the intrinsic stress of a second vertical field-effect transistor in the plurality of vertical field-effect transistors is a compressive stress and the induced stress of the at least one fin structure of the second vertical field-effect transistor is a tensile stress.

18. The semiconductor structure of claim 16, wherein the metal gate layer comprises tungsten.

19. The semiconductor structure of claim 16, wherein each vertical field-effect transistor in the plurality of vertical field-effect transistors comprises:
an additional top spacer layer formed in contact with the high-k dielectric layer, the work function metal layer, the metal gate layer, and the at least one fin structure.

20. The semiconductor structure of claim 19, wherein each vertical field-effect transistor in the plurality of vertical field-effect transistors comprises:
a drain contact layer in contact with the additional spacer layer and the at least one fin structure.

* * * * *